United States Patent [19]

Chiou

[11] Patent Number: 5,991,152
[45] Date of Patent: Nov. 23, 1999

[54] CPU HEAT SINK FASTENER

[76] Inventor: Ming Horng Chiou, 4F., No.36, Yu Min Rd., Tu Cheng City, Taiwan

[21] Appl. No.: 09/106,104

[22] Filed: Jun. 29, 1998

[51] Int. Cl.⁶ ..................................................... H05K 7/20
[52] U.S. Cl. ......................... 361/704; 257/718; 248/510; 24/458
[58] Field of Search .............................. 24/296, 457, 458, 24/625; 165/80.2, 80.3, 185; 174/16.3; 248/505, 510; 257/707, 713, 718–719, 722, 726–727; 361/704, 707, 709, 710, 697

[56] References Cited

U.S. PATENT DOCUMENTS

| | | | |
|---|---|---|---|
| 5,594,624 | 1/1997 | Clemens et al. | 361/706 |
| 5,771,153 | 6/1998 | Sheng | 361/697 |
| 5,864,464 | 1/1999 | Lin | 361/697 |
| 5,870,288 | 2/1999 | Chen | 361/704 |
| 5,873,406 | 2/1999 | Horng | 361/697 |

*Primary Examiner*—Gregory Thompson

[57] ABSTRACT

A CPU heat sink fastener includes a retainer member having two V-shaped arms extended from a flat base thereof and respectively hooked in respective locating holes on a CPU module to hold down a heat sink on the CPU module, and a holding down member having a longitudinal slot forced into engagement with the V-shaped arms. The holding down member is pushed to a position below reinforcing ribs at the V-shaped arms to force the V-shaped arms inwards and to secure the retainer member in place.

3 Claims, 6 Drawing Sheets

CPU HEAT SINK FASTENER

BACKGROUND OF THE INVENTION

The present invention relates to a CPU heat sink fastener for fastening to a CPU module to secure a heat sink to the CPU module, and more particularly to such a CPU heat sink fastener which has a simple structure, and can easily be positively installed.

Various CPU heat sink fasteners have been developed for use in securing a heat sink to a CPU module. These heat sink fasteners commonly use the curved spring plate to secure a heat sink to the CPU module, and lock levers to lock the curved spring plate in position. However, the lock levers tend to be forced out of locking position during delivery.

SUMMARY OF THE INVENTION

It is one object of the present invention to provide a CPU heat sink fastener which can easily be installed to firmly secure a heat sink to a CPU module. It is another object of the present invention to provide a CPU heat sink fastener which is firmly secured in position when installed. According to the invention, the CPU heat sink fastener comprises a retainer member having two V-shaped arms extending from a flat base thereof and respectively hooked in respective locating holes on a CPU module to hold down a heat sink on the CPU module, and a holding down member having a longitudinal slot forced into engagement with the V-shaped arms and positioned below reinforcing ribs on the V-shaped arms to force the V-shaped arms inwards and to secure the retainer member in place.

DETAILED DESCRIPTION OF THE PREFERRED EMBODIMENT

Figure 1:
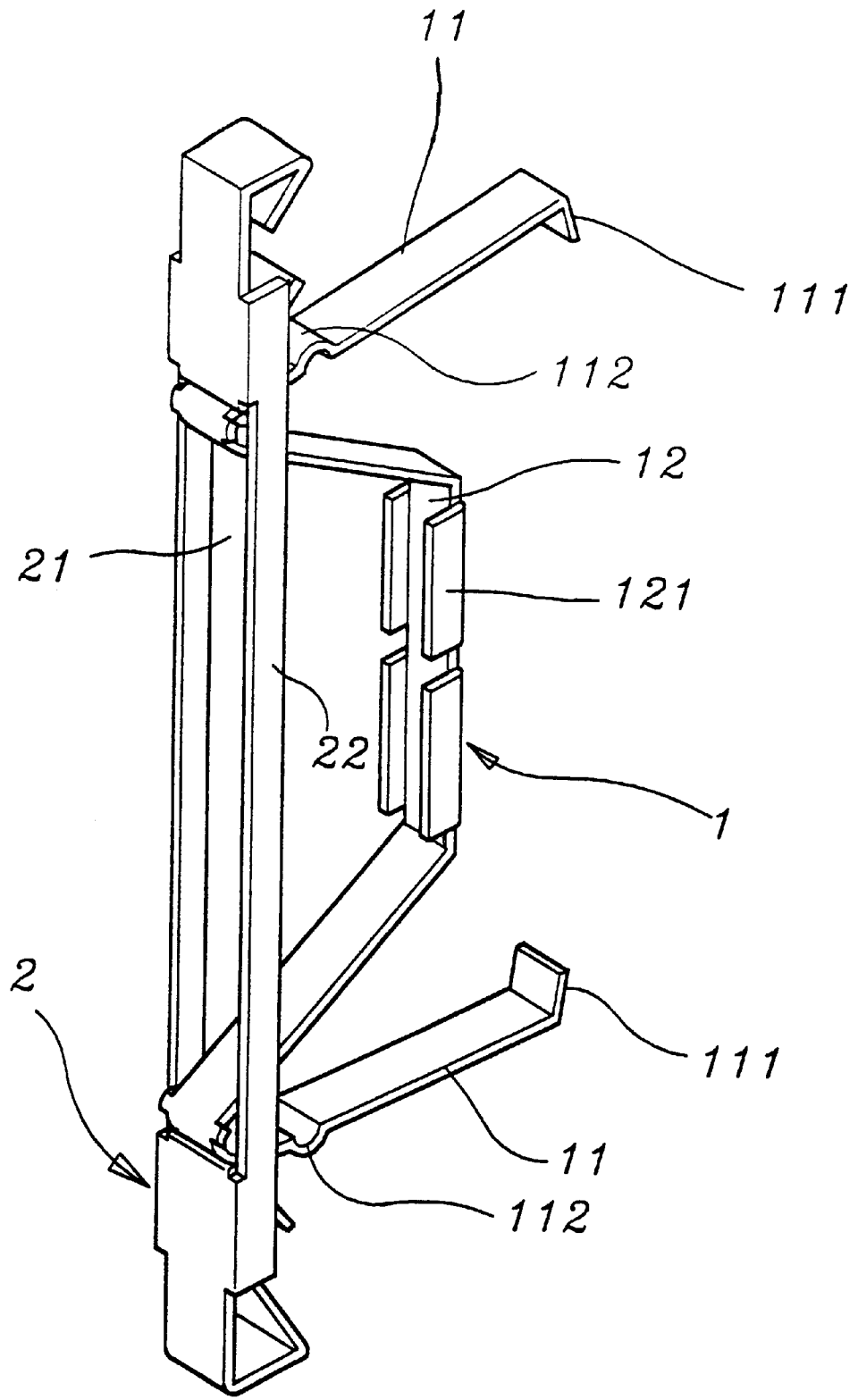
FIG. 1 is a perspective view of a CPU heat sink fastener according to the present invention.
Figure 2:
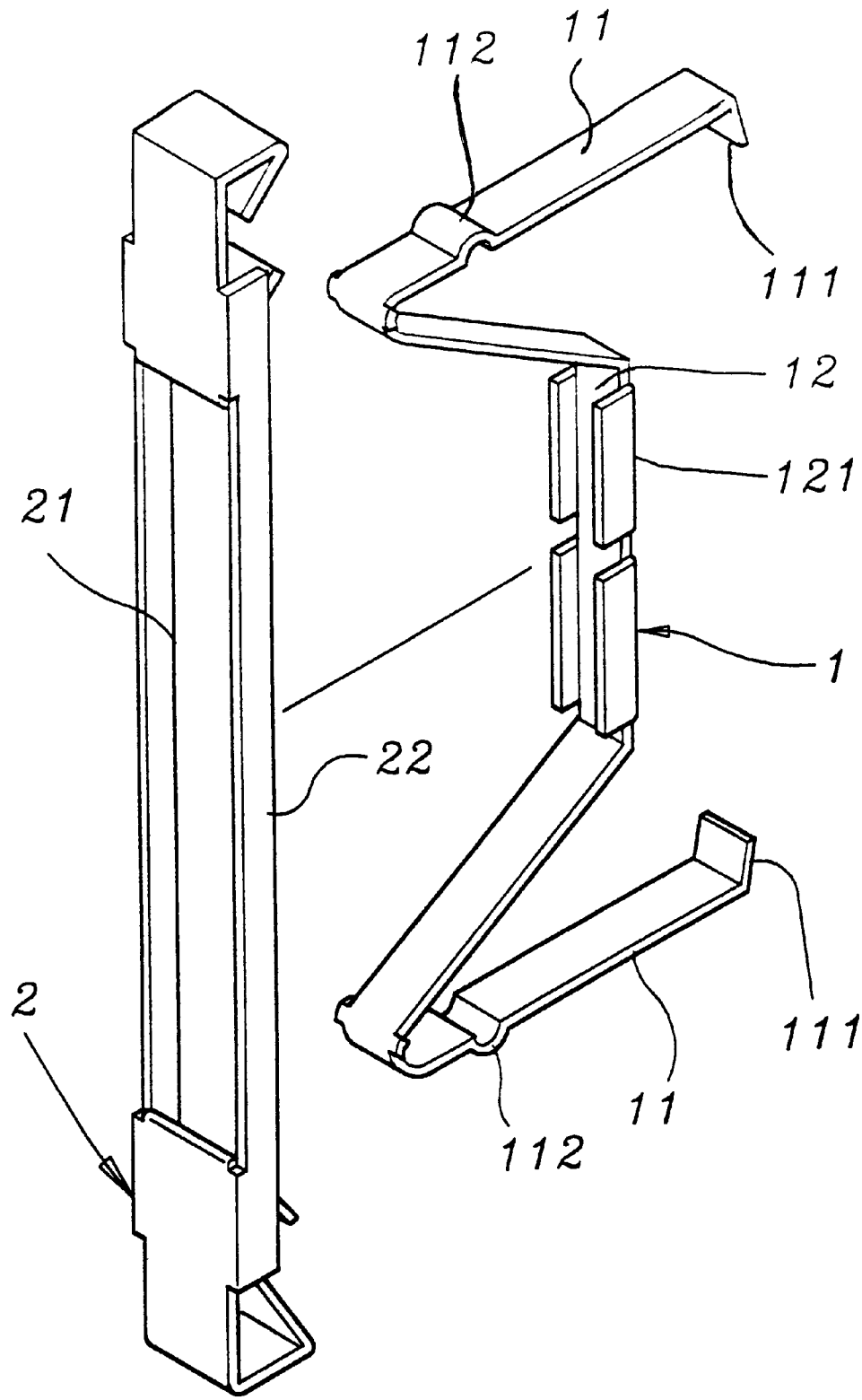
FIG. 2 is an exploded view of the CPU heat sink fastener shown in FIG. 1.

Referring to FIGS. 1 and 2, a CPU heat sink fastener in accordance with the present invention is generally comprised of a retainer member 1, and a holding down member 2. While two fasteners are illustrated and preferred, those skilled in the art will appreciate that one of the fasteners could possibly be eliminated or replaced by a conventional fastener. The retainer member 1 comprises a narrow, elongated, flat horizontal base 12, two substantially narrow, elongated, flat, V-shaped arms 11 extending from two opposite ends of the horizontal base 12 and terminating in a respective hooked portion 111, pairs of upright reinforcing flanges 121 symmetrically raised from two opposite long sides of the horizontal base 12, and two reinforcing ribs 112 respectively provided on the V-shaped arms 11. The holding down member 2 is an elongated member having a longitudinal slot 21, and two downwardly extended vertical reinforcing flanges 22 at two opposite long sides of the longitudinal slot 21.

Figure 3:
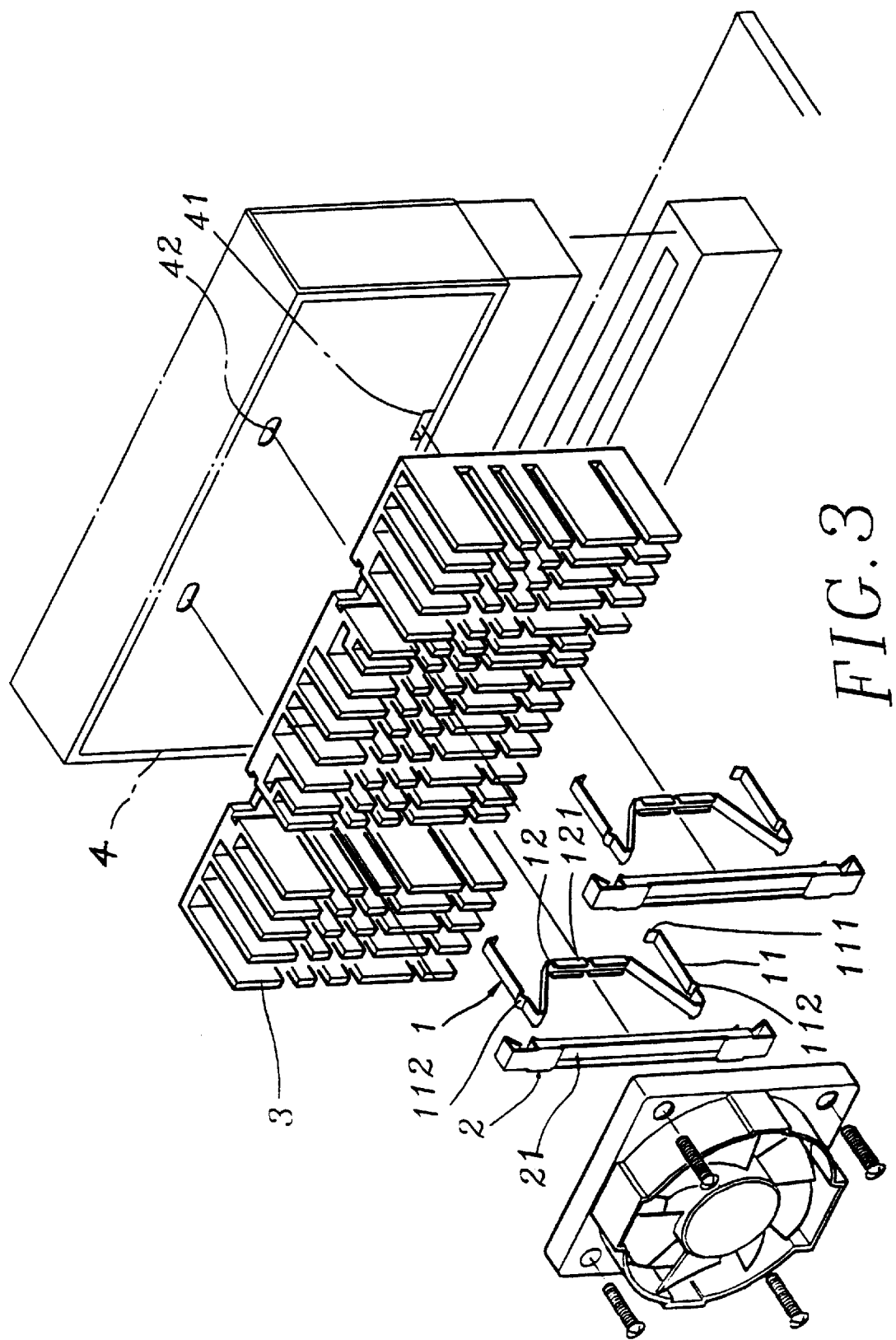
FIG. 3 is an exploded view of an application example of the present invention.
Figure 4:
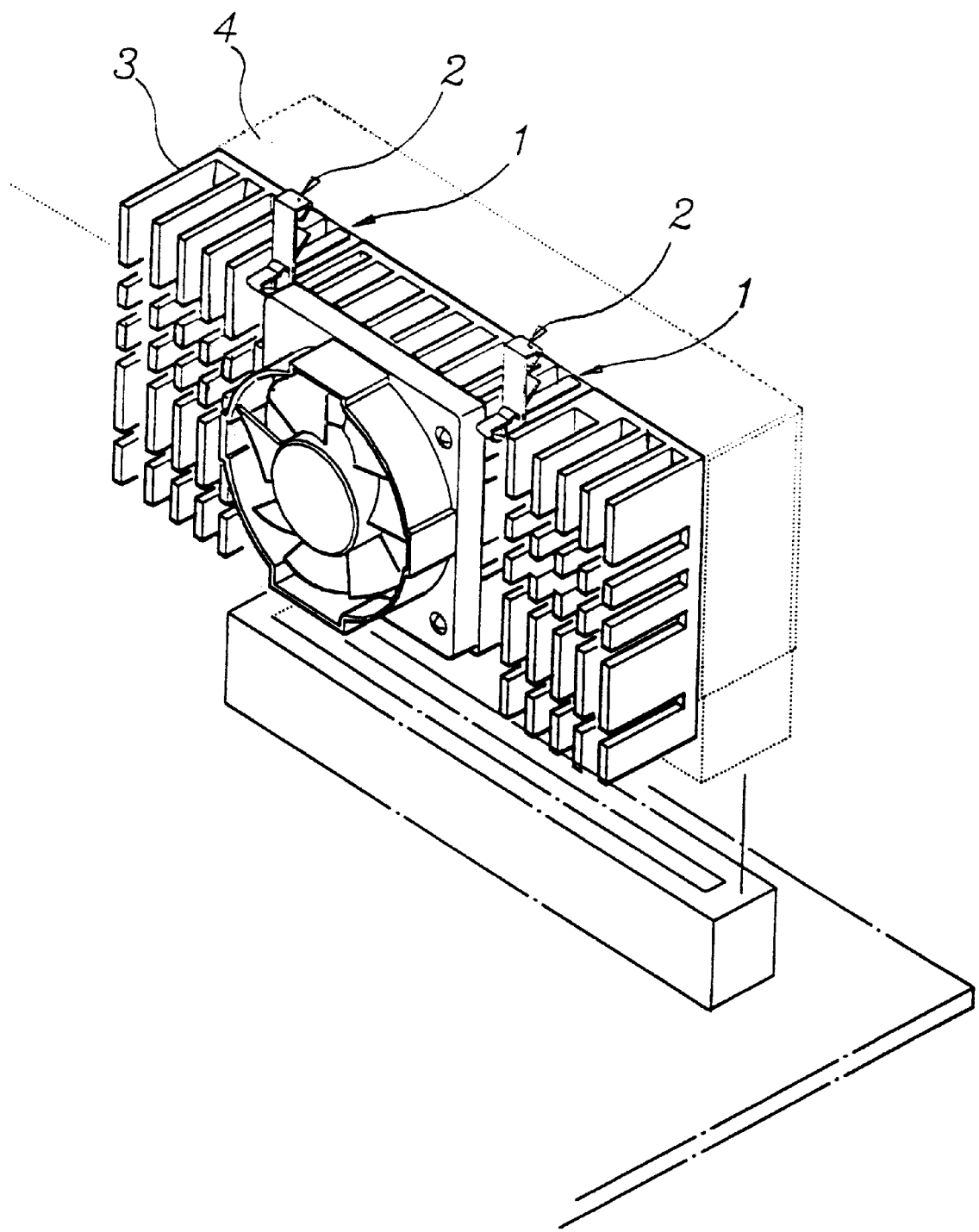
FIG. 4 is an assembly view of FIG. 3.

Referring to FIGS. 3 and 4, when in use, the horizontal base 12 of the retainer member 1 is closely attached to the top side wall of the heat sink 3. Then the hooked portions 111 of the V-shaped arms 11 of the retainer member 1 are respectively hooked in respective locating holes 42 on the CPU module 4 to secure the heat sink 3 to the CPU module 4, and the holding down member 2 is fastened to the retainer member 1 by forcing the longitudinal slot 21 into engagement with the V-shaped arms 11, and causing two opposite end edges of the longitudinal slot 21 of the holding down member 2 to be positioned below the reinforcing ribs 112 of the V-shaped arms 11.

Figure 5:
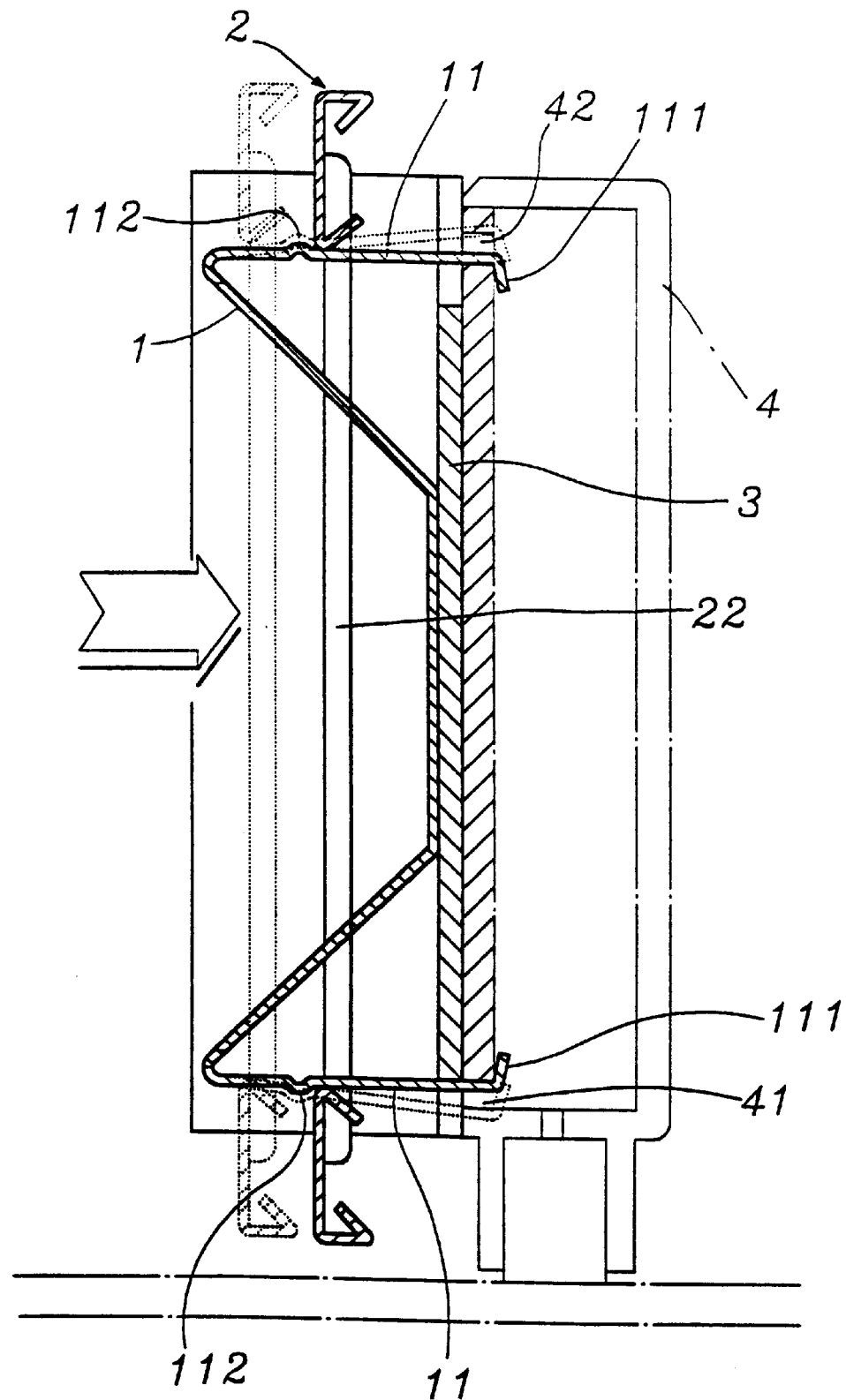
FIG. 5 is a schematic drawing showing the installation of the CPU heat sink fastener according to the present invention.
Figure 6:
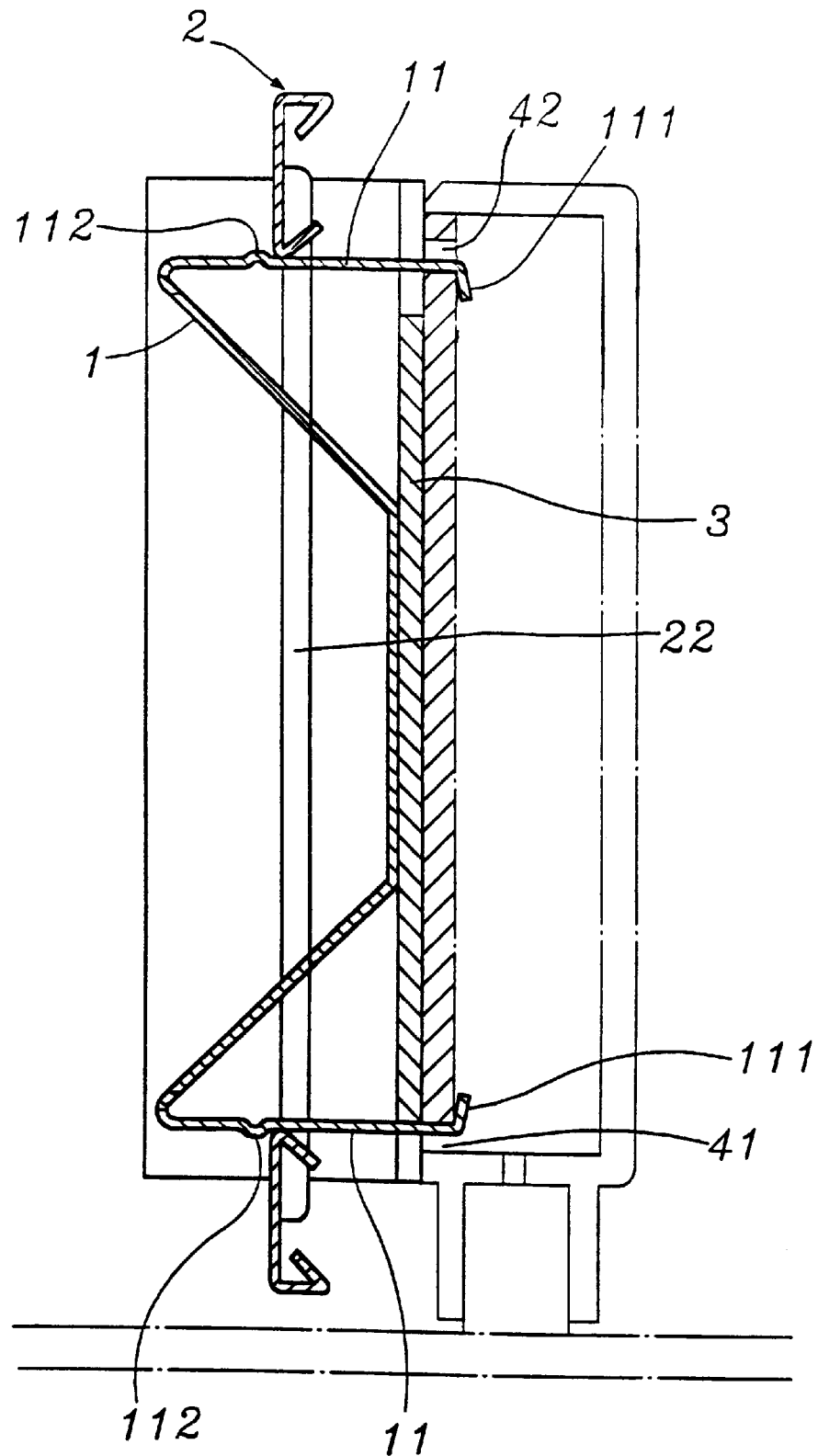
FIG. 6 is similar to FIG. 5 but shows the CPU heat sink fastener well installed.

Referring to FIGS. 5 and 6, the V-shaped arms 11 of the retainer member 1 are springy, and therefore the hooked portions 111 of the V-shaped arms 11 can be conveniently hooked in the respective locating holes 42 on the CPU module 4. When the holding down member 2 is forced into engagement with the V-shaped arms 11 and positioned below the reinforcing ribs 112, the holding down member 2 imparts an inward pressure to the V-shaped arms 11, thereby causing the hooked portions 111 of the V-shaped arms 11 to be firmly secured to the respective locating holes 42 on the CPU module 4. Because the holding down member 2 is stopped below the reinforcing ribs 112 of the V-shaped arms 11, the holding down member 2 is firmly retained by the retainer member 1.

While only one embodiment of the present invention has been shown and described, it will be understood that various modifications and changes could be made thereunto without departing from the spirit and scope of the invention disclosed.

What the invention claimed is:

1. A CPU heat sink fastener comprising:
    a retainer member for fastening to a CPU module to secure a heat sink to the CPU module, said retainer member comprising a narrow, elongated, flat horizontal base for attaching to the heat sink, two substantially narrow, elongated, flat V-shaped arms respectively extending from two opposite ends of said horizontal base, two hooked portions respectively extending from said V-shaped arms at one end remote from said flat base for hooking in respective hook holes on the CPU module, and two reinforcing ribs provided on said V-shaped arms at an outer side of respective said arms; and
    a holding down member fastened to said retainer member to secure said retainer member in place, said holding down member having a longitudinal slot forced into engagement with the V-shaped arms of said retainer member and positioned below the reinforcing ribs of said V-shaped arms to force said V-shaped arms inwards.

2. The CPU heat sink fastener of claim 1 wherein said retainer member comprises pairs of upright reinforcing flanges symmetrically raised from two opposite long sides of said horizontal base.

3. The CPU heat sink fastener of claim 1 wherein said holding down member comprises two downwardly extended vertical reinforcing flanges at two opposite long sides of said longitudinal slot.

\* \* \* \* \*